United States Patent
Furukawa et al.

(10) Patent No.: US 6,333,229 B1
(45) Date of Patent: Dec. 25, 2001

(54) METHOD FOR MANUFACTURING A FIELD EFFECT TRANSITOR (FET) HAVING MIS-ALIGNED-GATE STRUCTURE

(75) Inventors: Toshiharu Furukawa, Essex Junction; Mark C. Hakey, Fairfax; Steven J. Holmes, Milton; David V. Horak, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/523,839

(22) Filed: Mar. 13, 2000

(51) Int. Cl.$^7$ .................................................. H01L 21/336
(52) U.S. Cl. ........................... 438/270; 438/182; 438/105
(58) Field of Search ..................................... 438/268–272, 438/105, 589, 931, 690, 182; 257/330–334

(56) References Cited

U.S. PATENT DOCUMENTS

| | | |
|---|---|---|
| 4,656,076 | 4/1987 | Vetanen et al. . |
| 4,965,218 | 10/1990 | Geissberger et al. . |
| 4,997,778 | 3/1991 | Sim et al. . |
| 5,017,504 | 5/1991 | Nishimura et al. . |
| 5,237,192 | 8/1993 | Shimura . |
| 5,496,779 | 3/1996 | Lee et al. . |
| 5,550,065 | 8/1996 | Hashemi et al. . |
| 5,786,610 | 7/1998 | Nakanishi . |
| 5,817,558 | 10/1998 | Wu . |
| 5,856,232 | 1/1999 | Yang et al. . |
| 5,963,791 | * 10/1999 | Brown et al. .......................... 438/105 |
| 6,083,836 | * 7/2000 | Roder .................................... 438/690 |

* cited by examiner

Primary Examiner—David Nelms
Assistant Examiner—Dung A Le
(74) Attorney, Agent, or Firm—McGuireWoods, LLP; Mark F. Chadurjian

(57) ABSTRACT

A viable T-gate FET is produced even when the cap of the "T" is mis-aligned from the stem of the "T". A subtractive etch is used to selectively etch the material forming the cap of the T-gate and the material forming the stem of the T-gate in order to avoid the etching away of portions of the stem if the cap is mis-aligned relative to the stem. To that end, germanium (Ge) may be used as the material for the cap of the T-gate and poly silicon (polySi) may be used as the material for the stem of the T-gate. Since germanium can be etched selectively relative to silicon from 10:1 to as much as 20:1, the cap of the T can be formed without appreciable damage to the stem portion and thus without damage to the resultant FET device.

11 Claims, 3 Drawing Sheets

METHOD FOR MANUFACTURING A FIELD EFFECT TRANSITOR (FET) HAVING MIS-ALIGNED-GATE STRUCTURE

BACKGROUND OF THE INVENTION

1. Field of the Invention

The present invention generally relates to a method of manufacturing a T-gate field effect transistor (FET) and, more particularly, to a method of manufacturing a viable T-gate FET even when the cap of the "T" is mis-aligned from the stem of the "T".

2. Description of the Related Art

In conventional FET processing the limits of the poly gate length and the channel length are dependent on the lithography resolution. The self-aligned, or symmetrical, T-gate transistor allows for a lithography-independent sub 0.1 $\mu$m channel and a longer gate while optimizing resistance and capacitance characteristics.

Self-aligned FETs are widely used in high speed integrated circuits to minimize the gate-source and gate-drain parasitic capacitance. Most self-aligning processes use a refractory metal as a mask for self aligning implantation of the n+ (or p+) source and drain regions. In these processes, it is important to control the distance between the gate conductor and the n+ source and drain implant regions since these parameters effect the speed and performance of the FET.

Control of n+ source and drain implants to the gate metal may be accomplished by using a T-shaped gate. Conventionally, this requires the deposition of another layer, either a dielectric or metal, on top of a refractory metal and acts as the mask for subsequent etching and undercutting of the underlying refractory gate. The etching process is done either by wet chemical etch or dry etching. The sacrificial top layer is then removed prior to high temperature annealing of the n+ source and drain implants due to lack of high temperature stability of the top layer. Removing the top layer eliminates the choice of fabricating the ohmic metal contacts in a self-aligned manner with respect to the gate metal.

U.S. Pat. No. 5,550,065 to Hashemi et al. discloses a method for fabricating a self-aligned FET on a surface of a semiconductor substrate using LaB/TiWN as a T-shape gate structure formed by a controllable dry etching of the TiWN using LaB$_6$ as the mask which allows control of n+ implant distance to gate edge. The high temperature stability of the LaB$_6$/TiWN structure allows the "T-shaped" gate to be preserved during the high temperature post n+ source and drain implant annealing step and subsequently to be used for the self-aligned formation of source and drain ohmic contact metals on the surface of the substrate and in spaced relationship while simultaneously depositing extra low resistance metal over the "T-shaped" gate metal, producing low gate resistance.

The process for manufacturing T-shaped gates requires high tolerances between the cap (horizontal top) of the "T" and the stem (the vertical portion) of the "T". When forming the cap of the T with a subtractive etch process, if there is any mis-alignment between the cap and the stem, some of the stem of the T will be accidentally but unavoidably etched away leading to device failure.

U.S. Pat. No. 4,965,218 to Geissberger et al. discloses a self aligned T-gate FET which allows for misalignment between the cap of the T and the stem of the T while still producing a viable device. In particular, windows are patterned in an encapsulant layer over the gate area. A non-critically aligned photoresist mask over the encapsulant layer is used to expose substantially the entire top surface of the stem of the T-gate. Gold is subsequently evaporated onto the photoresist and gate stem and lifted off with the photoresist to produce a non-critically aligned (+/−0.5 micron) cap of the T-gate which is firmly bonded to the stem. The technique allows for gross misalignment between the cap and the stem of the T-gate metallization without increasing the FET gate length. Hence, the stem and the cap can be substantially mis-aligned with respect to one another and still produce a viable operating device. However, this method relies on an encapsulant layer to protect the stem portion of the T-gate as the cap is formed and further is expensive owing to the use of gold as the material for the cap.

SUMMARY OF THE INVENTION

It is therefore an object of the present invention to provide a simplified method of producing a viable T-gate FET allowing for misalignment between the cap and stem of the T.

According to the invention, a subtractive etch is used to selectively etch the material forming the cap of the T-gate and the material forming the stem of the T-gate in order to avoid the etching away of portions of the stem if the cap is mis-aligned relative to the stem. To that end, germanium (Ge) is used as the material for the cap of the T-gate and silicon is used as the material for the stem of the T-gate. Since germanium can be etched selectively relative to silicon from 10:1 to as much as 20:1, depending on the etching technique, the cap of the T can be formed without appreciable damage to the stem portion.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
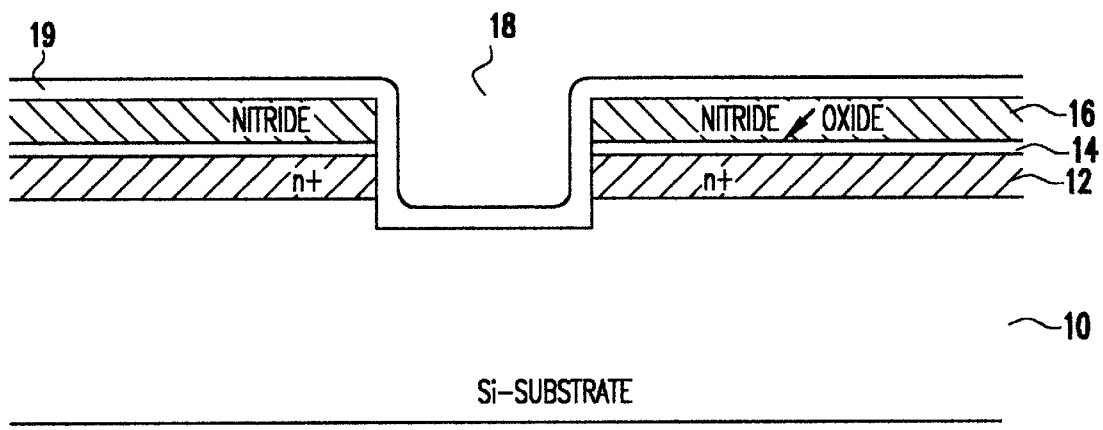
FIG. 1 is a view of various layers on a silicon substrate prior to forming the T-gate according to a first embodiment of the present invention.

Referring now to the drawings, and more particularly to FIG. 1, a standard (100) silicon wafer surface 10 is doped n+ (or p+) type dopant 12 by ion implantation after thermal oxide $SiO_2$ ($\approx$20 nm) is grown 14. A chemical vapor deposition (CVD) nitride 16 ($\approx$100 nm) is then deposited on top of the thermal oxide 14. A damascene trench pattern 18 is defined using a hybrid resist technique or phase-edge lithography as described in U.S. Pat. No. 5,776,660 to Hakey et al., herein incorporated herein by reference. The trench pattern is a loop such as that described in U.S. Pat. No. 5,998,835, herein incorporated by reference. A conventional lithography technique can also be used. The damascene trench 18 is etched into the silicon substrate 10 beyond the n+ (or p+) region 12. A thin diffusable layer 19 of arsenic doped glass (ASG) (or BoroSilicate glass (BSG)) is then deposited. An optional layer of undoped glass (SiO ) (not shown) may be deposited on top of the diffusable layer 19 if ASG is used as the diffusable layer 19 to prevent the arsenic from becoming airborne in subsequent steps.

Figure 2:
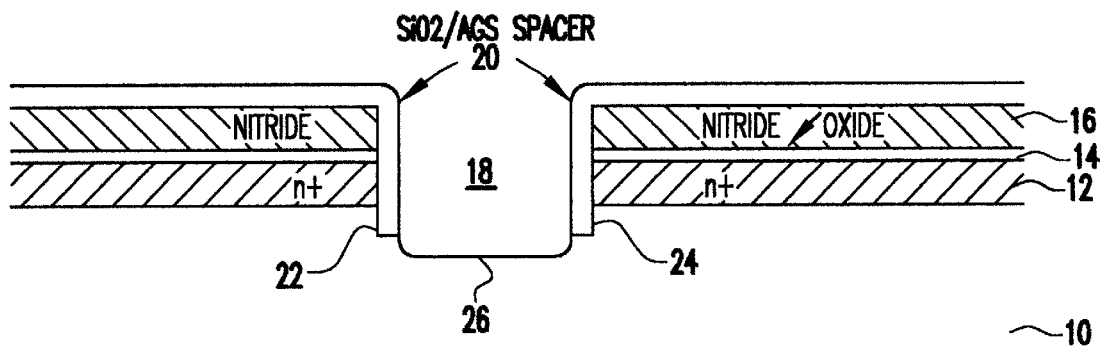
FIG. 2 is a further processed view as that shown in FIG. 1 having spacers comprising a diffusable material formed on the side walls of a damascene trench.

Referring to FIG. 2, an SiO /ASG spacer 20 is formed by etching the diffusable layer 19 on the side wall of the trench 18. The silicon substrate 10 is slightly etched down by spacer over-etching. The amount of silicon over-etching is about 1–10 nm to provide the right amount of diffusion active gate area.

Figure 3:
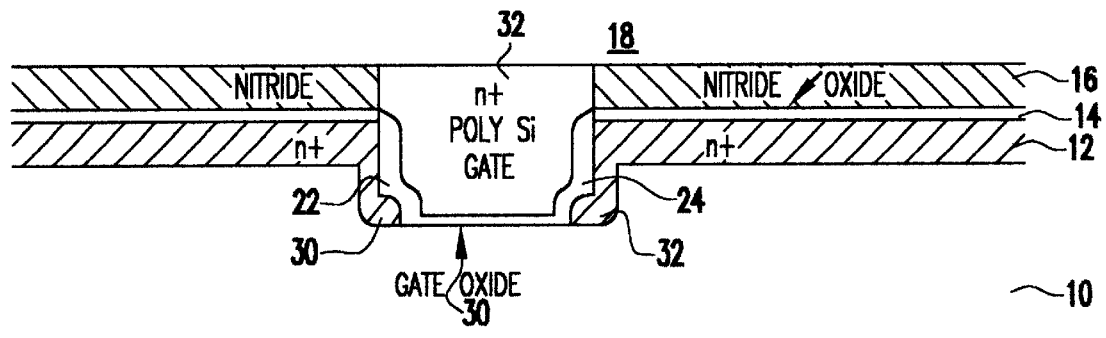
FIG. 3 is a further processed view as that shown in FIG. 2 showing the stem portion of the T-gate comprising doped polySi.

Referring to FIG. 3, the side walls 22 and 24 are doped by out-diffusion from the ASG diffusable layer 19. This can be done by annealing the diffusable layer 19 and the substrate 10 so the diffusable element (i.e. arsenic) in the diffusable layer 19 diffuses into the substrate 10 adjacent the sidewalls 22 and 24 and adjacent a portion of the bottom 26 of the trench 18. The out-diffusion forms the diffusion extensions 30 and 32 which extend from the diffusion layer 12 down the sidewalls 22 and 24 of the trench 18 and under a portion of the bottom 26 of the trench 18.

The length of the portion under the bottom 26 of the trench 18 that the diffusion extensions 30 and 32 extend is variable with the duration and temperature of annealing and with the thickness of the diffusable layer 19 on the sidewalls 22 and 24 of the trench 18. For example, the portion of the diffusion extensions 30 and 32 under and adjacent the bottom 26 of the trench 18 may be made longer by making the diffusable layer 19 on the sidewalls 22 and 24 thicker.

The diffusable layer 19 is then stripped, sacrificial oxide is grown, and gate tailor implant is made at the bottom of the trench 18. Gate oxide 30 is grown after sacrificial oxide strip. Of course dielectric materials other than silicon oxide 30 may also be used such as silicon nitride, zirconium oxide, aluminum oxide, titanium oxide, tantalum oxide or blends of these materials. Thicker oxide is grown on the doped {110} silicon trench side walls. Doped poly-Si 32 is deposited and planarized to the nitride surface 16.

Figure 4:
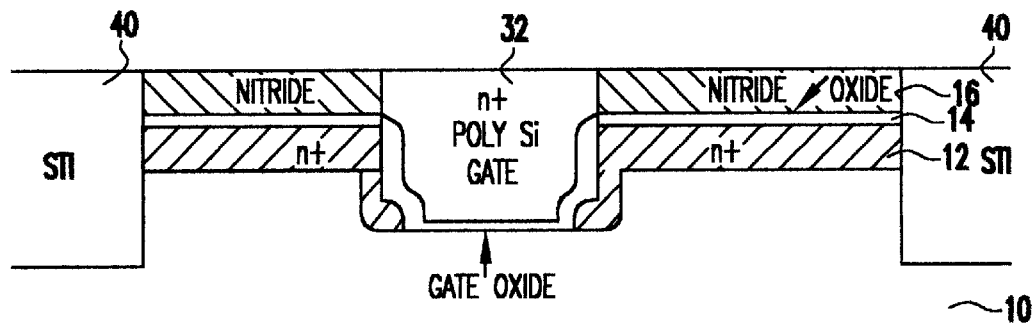
FIG. 4 is a further processed view as that shown in FIG. 3 showing STI trenches formed defining the active device area.

As shown in FIG. 4, a shallow trench isolation (STI) trench 40 is etched with photo resist as a mask. When hybrid resist or 0/180 degree alternating phase shift is used to print the spaces that will be used to etch the stem of the 'T', the resist space prints as a loop as viewed from the top-down of the wafer surface. That is, if the reticle feature is a rectangle, the first space will print as a narrow loop around the perimeter of that rectangle. In the case of a gate conductor application, it is usually desirable to cut these loops, so that multiple gate features do not become electrically shorted together.

Still referring to FIG. 4, the damascene trench 18 filled with PolySi 32 in the isolation area is etched away, cutting off the looped poly-Si damascene trench 18. The isolation trench side walls (exposed silicon-substrate and doped Poly-Si) is oxidized and the trench 18 is filled by CVD $SiO_2$ and planarized.

Figure 5:
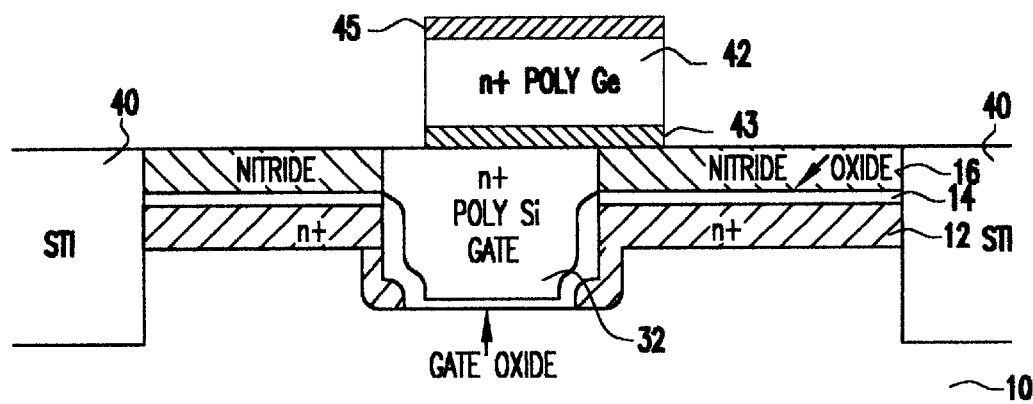
FIG. 5 is a further processed view as that shown in FIG. 4 showing the PolyGe cap portion of the T-gate mis-aligned with the PolySi stem portion.

Referring to FIG. 5, gate wiring conductor such as n+ doped polycrystalline Ge (PolyGe) 42 is deposited and is etched with a patterned photo resist as an etching mask. The polyGe gate wiring forms the cap 42 of the T-gate and the n+polySi forms the stem 32 of the T-gate. The gate wiring material is chosen so that the etching of the material does not etch out the gate n+ polySi and damage the device structure. This etch selectivity allows for the gate wiring to be misaligned to the underlaying gate while still resulting in a viable device.

By way of example, a preferred reactive ion etch (RIE) condition which would etch germanium selectively to silicon includes $CF_4/O_2$ at 40–50% $O_2$, 250 mtorr, 200 W Rf power, 100 sccm flow rate which provides a Ge etch rate of 500 nm/min and an Si etch rate of 25 nm/min, with an etch rate ratio of 20. Nitrogen may be added to enhance the passivation of germanium sidewalls, providing less undercut of the germanium profile.

In other words, the present invention provides a method of forming a T-gate structure for field effect transistor (FET), comprising the steps of forming a stem portion (or lower portion) 32 of the T-gate made of a first gate conductor material which has a first etch rate, depositing a second gate conductor material over the stem portion 32, where the second gate conductor material has a second etch rate that is greater than the first etch rate, and etching the second gate conductor material to form a cap (or higher portion) 42 of the T-gate, wherein the stem portion 32 of the T-gate is unaffected by the etching step even if the cap 42 of the T-gate is mis-aligned with respect to the stem portion 32 of the F-gate. Preferably, the second gate conductor material has an etch rate at least five times greater than the first gate conductor material. As shown in FIG. 5, for example, the first gate conductor material may be poly silicon forming the stem 32, and the second gate conductor material may be germanium forming the cap 42.

Still referring to FIG. 5, in the case of producing a CMOS device a conductor such as cobalt silicide 43 may be used on the conductor 42 to provide a means for shunting charge from n+ and p+ devices, to avoid build-up of capacitance at the n+ and p+ interfaces. This silicide could be at one of two locations, either over the poly silicon trench 32 and underneath the germanium film 42 or on top of the germanium film 42 (in which case it would be cobalt germanicide 45 rather than cobalt silicide 43).

Another preferred RIE condition which is suitable to etch germanium selectively to silicon includes $Cl_2$ at 73 sccm, $N_2$ at 7 sccm, 4 mtorr pressure, at 150 W for the main etch of the bulk of Ge film. As the Ge etch nears completion, switch to $Cl_2$ 73 sccm, O—He 40 sccm, (8 sccm equivalent $O_2$) 60 W power, 20 mtorr pressure.

The former process would be preferable, as it would provide higher selectivity to silicon, but the latter process could be used as well.

Figure 6:
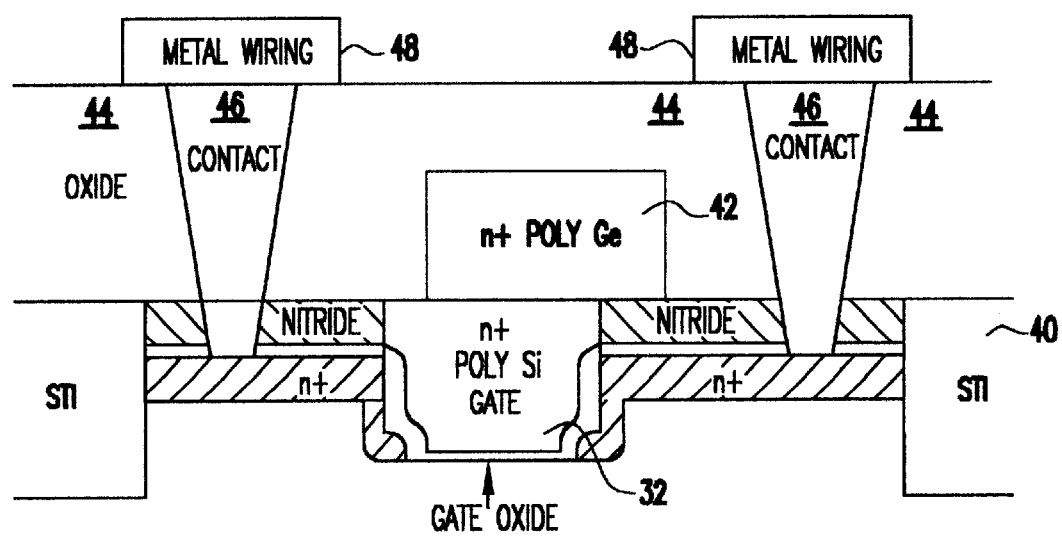
FIG. 6 is a further processed view as that shown in FIG. 5 showing the completed FET device having a mis-aligned T-gate.

As shown in FIG. 6, passivation material (e.g., oxide) 44 is deposited over the device and contact holes 46 are etched into the oxide 44. Finally, the device diffusions 14 are connected to wiring metal 48 through tungsten (W) filled contact holes 46. As shown the resultant FET device comprises a T-gate structure having a cap portion 42 which may be mis-aligned with the stem portion 32 of the T-gate. Hence, large tolerances in cap to stem alignment are possible without damage to the resultant device.

Figure 7:
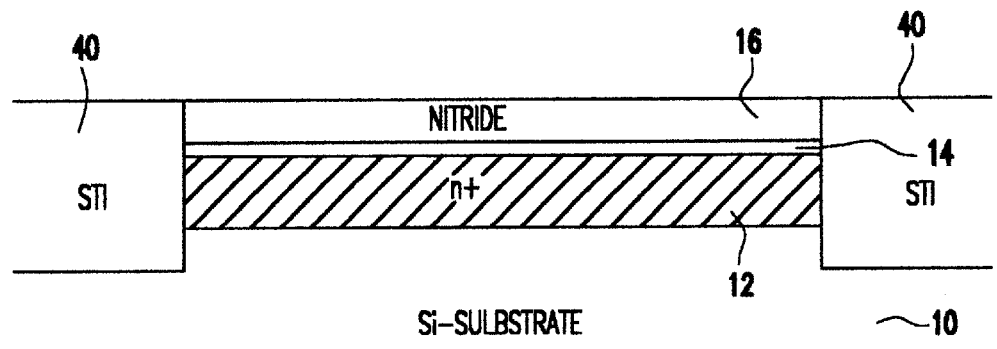
FIG. 7 is a view of various layers on a silicon substrate prior to forming the T-gate according to a second embodiment of the present invention.
Figure 8:
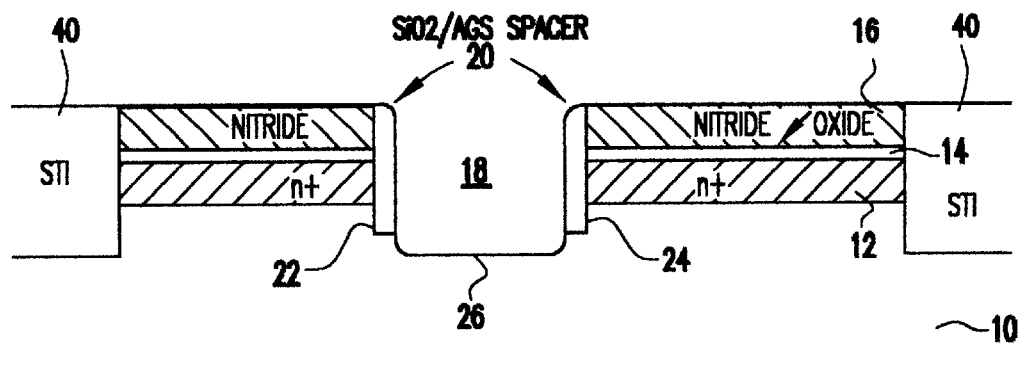
FIG. 8 is a further processed view as that shown in FIG. 7 having spacers comprising a diffusable material formed on the side walls of a damascene trench.
Figure 9:
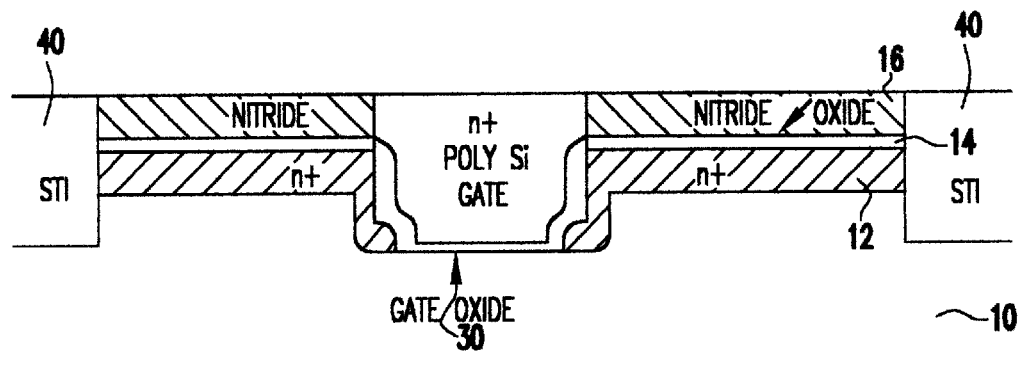
FIG. 9 is a further processed view as that shown in FIG. 8 showing the stem portion of the T-gate comprising doped polysi.

FIGS. 7–9 are directed to an alternate embodiment of the present invention where the shallow trench isolation (STI) trench 40 is formed first and then the damascene gate device is formed.

As shown in FIG. 7, a silicon substrate 10 surface is doped by ion implantation to form an n+ doped layer 12 after thermal oxide 14 is grown, and then CVD nitride layer 16 is deposited. The active area is defined by a CVD $SiO_2$ filled STI trench 40. That is, the STI trench etch is followed by the trench fill and planarization.

As shown in FIG. 8, the damascene pattern is defined using hybrid-resist technique or phase-edge lithography as previously discussed. Again, the photo-resist-space pattern is looped. A trench 18 is etched into silicon substrate beyond n+ (or p+) region. Although a resist pattern is looped over STI trench 40 and the active area, the damascene trench 18 is formed only in the active area by selectively etching Si substrate 10 to $SiO_2$. A thin diffusable layer 19 of ASG (or BSG) and thin layer of undoped glass are deposited (not shown) as previously described. A spacer 20 is then formed with the diffusable layer 19 on the side walls 22 and 24 of the trench 18. The silicon substrate 10 is etched down by a controlled amount by spacer over-etching.

Referring to FIG. 9, the side walls 22 and 24 are doped by out-diffusion from the diffusable layer forming the spacers 20. The diffusable layer is stripped, sacrificial oxide is grown, and gate tailor implant is made at the bottom of the trench. Gate oxide 30 is grown after sacrificial oxide strip. Doped poly-Si is deposited and planarized to the nitride surface 16.

From this point the process continues as shown in FIGS. 5 and 6. Gate wiring conductor such as n+ doped polycrystalline Ge (PolyGe) 42 is deposited and is etched with a patterned photo resist as an etching mask to form the cap of the T-gate. The gate wiring material is chosen so that the etching of the material does not etch out the gate n+ polySi forming the stem of the T-gate and damage the device structure. This etch selectivity allows for the gate cap wiring to be mis-aligned to the underlaying stem portion of the T-gate. Thereafter, as shown in FIG. 6, a passivation material (e.g., oxide) 44 is deposited over the device an contact holes 46 are etched into the oxide 44. The device diffusions are connected to the wiring metal through W filled contact holes 44.

In this manner since germanium can be etched selectively relative to silicon from 10:1 to as much as 20:1, depending on the etch technique used, the cap portion 42 of the T-gate can be formed without appreciable damage to the stem portion 32 of the T-gate even when the cap 42 and the stem 32 are substantially mis-aligned.

While the invention has been described in terms of a single preferred embodiment, those skilled in the art will recognize that the invention can be practiced with modification within the spirit and scope of the appended claims.

We claim:

1. A method of forming a T-gate structure for a field effect transistor (FET), comprising the steps of:

forming a stem portion of a T-gate comprising a first gate conductor material having a first etch rate;

depositing a second gate conductor material over said stem portion, said second gate conductor material having a second etch rate that is greater than said first etch rate; and etching said second gate conductor material to form a cap portion of the T-gate, wherein said stem portion of the T-gate is unaffected by said etching step even if said cap portion of said T-gate is mis-aligned with respect to said stem portion of said T-gate.

2. A method of forming a T-gate structure for a field effect transistor (FET) as recited in claim 1 wherein said first gate conductor material comprises polysilicon and said s econd gate conductor material comprises germanium.

3. A method of forming a T-gate structure for a field effect transistor (FET) as recited in claim 2 wherein said etching step comprises etching with $CF_4/O_2$ at 40–50% $O_2$, 250 mtorr, 200 W Rf power, and a 100 sccm flow rate.

4. A method of forming a T-gate structure for a field effect transistor (FET) as recited in claim 3 further comprising adding nitrogen with said $CF_4/O_2$.

5. A method of forming a T-gate structure for a field effect transistor (FET) as recited in claim 2 wherein said etching step comprises the steps:

etching with $Cl_2$ at 73 sccm, $N_2$ at 7 sccm, 4 mtorr pressure, and 150 W for a first etch of said germanium; and etching with $Cl_2$ 73 sccm, O—He 40 sccm, and 60 W at 20 mtorr pressure for a second etch of said germanium.

6. A method of forming a T-gate structure for a field effect transistor (FET) as recited in claim 1, wherein said step of forming said stem portion comprises the steps of:

forming a damascene trench; and filling said damascene trench with said first gate conductor material, wherein said step of depositing said second gate conductor material comprises depositing said second gate conductor material over at least a portion of said stem portion.

7. A method of forming a T-gate structure for a field effect transistor (FET) as recited in claim 6 further comprising the step of forming an shallow trench isolation (STI) trench on either side of said T-gate to define an active region.

8. In a method of forming a T-gate, the improvement comprising the steps of:

forming a lower portion of the T-gate comprising a first gate conductor material having a first etch rate; and forming a higher portion of the T-gate in electrical communication with the lower portion and comprising a second gate conductor material having a second etch rate that is greater than the first etch rate.

9. The method of claim 8 further comprising the steps of selecting first and second gate conductor materials wherein the second gate conductor material has an etch rate at least about five times greater than the first gate conductor material.

10. The method of claim 8 wherein the first gate conductor material includes polysilicon and the second gate conductor material includes germanium.

11. The method of claim 8, wherein:

the step of forming a lower portion of the T-gate includes the steps of forming a trench and filling the trench with the first gate conductor material; and the step of forming a higher portion of the T-gate includes the step of depositing the second gate conductor material at least partially on the first gate conductor material.

* * * * *